(12) United States Patent
Park

(10) Patent No.: US 8,723,166 B2
(45) Date of Patent: May 13, 2014

(54) ORGANIC LIGHT-EMITTING DISPLAY APPARATUS AND METHOD OF MANUFACTURING THE SAME

(75) Inventor: Yong-Woo Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 25 days.

(21) Appl. No.: 13/137,681

(22) Filed: Sep. 2, 2011

(65) Prior Publication Data
US 2012/0056184 A1 Mar. 8, 2012

(30) Foreign Application Priority Data

Sep. 6, 2010 (KR) ........................ 10-2010-0087032

(51) Int. Cl.
*H01L 27/32* (2006.01)
(52) U.S. Cl.
USPC .......... 257/40; 257/59; 257/72; 257/E51.018; 438/34
(58) Field of Classification Search
CPC .................. H01L 27/3272; H01L 27/3246
USPC ................ 257/40, 59, 72, E51.018; 438/34
See application file for complete search history.

(56) References Cited

U.S. PATENT DOCUMENTS

| 2003/0146695 A1* | 8/2003 | Seki ............................... 313/506 |
| 2008/0297032 A1 | 12/2008 | Kim et al. |
| 2009/0295280 A1 | 12/2009 | Yang |
| 2010/0117078 A1* | 5/2010 | Kuwabara et al. .............. 257/43 |

FOREIGN PATENT DOCUMENTS

| KR | 10-2003-0008379 A | 1/2003 |
| KR | 10-2004-0001695 A | 1/2004 |
| KR | 10-2005-0013853 A | 2/2005 |
| KR | 10-2007-0038824 A | 4/2007 |
| KR | 10-2008-0077815 A | 8/2008 |
| KR | 10-2008-0080772 A | 9/2008 |
| KR | 10-0858823 | 9/2008 |
| KR | 10-0911993 | 8/2009 |

* cited by examiner

*Primary Examiner* — Yu Chen
(74) *Attorney, Agent, or Firm* — Lee & Morse, P.C.

(57) ABSTRACT

An organic light-emitting display apparatus includes a light-shielding layer formed on a pixel defining layer to prevent external light or internal light from entering an active layer of a thin-film transistor (TFT), thus improving the stability of the active layer, and a method of manufacturing the organic light-emitting display apparatus.

20 Claims, 3 Drawing Sheets

ORGANIC LIGHT-EMITTING DISPLAY APPARATUS AND METHOD OF MANUFACTURING THE SAME

BACKGROUND

1. Field

Aspects of the present invention relate to an organic light-emitting display apparatus and a method of manufacturing the organic light-emitting display apparatus, and more particularly, to an organic light-emitting display apparatus including a thin film transistor (TFT) and a method of manufacturing the organic light-emitting display apparatus.

2. Description of the Related Art

An active matrix-type organic light-emitting display apparatus includes a thin-film transistor (TFT) and an organic light-emitting diode (OLED) connected to the TFT on a pixel basis.

An active layer of the TFT is formed of amorphous silicon or poly silicon. Recently, there has been an attempt to form the active layer with an oxide semiconductor.

The oxide semiconductor is susceptible to undergoing changes in its characteristics, such as a threshold voltage, an S-factor, and the like, due to introduction of moisture or oxygen from an outside environment. A problem, such as a change in a threshold voltage, caused by moisture or oxygen is aggravated by a direct current (DC) bias of a gate electrode during the driving of the TFT, and thus, in practice, DC stability emerges as the most significant problem in using the oxide semiconductor.

To reinforce a barrier feature of the oxide semiconductor against moisture or oxygen, a film formed of $AlO_x$ or TiN may be used. However, since such a film has to be formed by using reactive sputtering or atomic layer deposition (ALD), the film is difficult to apply to a large substrate, inhibiting mass productivity.

SUMMARY

Embodiments may provide an organic light-emitting display apparatus including a thin-film transistor (TFT) capable of blocking light irradiated from an external source, and a method of manufacturing the organic light-emitting display apparatus.

Embodiments may provide an organic light-emitting display apparatus which is easy to apply to a large display and has superior mass productivity, and a method of manufacturing the organic light-emitting display apparatus.

According to an embodiment, there is provided an organic light-emitting display apparatus including a substrate, a first electrode and a gate electrode on the substrate, an active layer insulated from the gate electrode, a source electrode and a drain electrode which are insulated from the gate electrode and contact the active layer, an insulating layer interposed between the source and drain electrodes and the active layer, a pixel defining layer (PDL) on the insulating layer, the pixel defining layer covering the source electrode and the drain electrode and the active layer and including an opening that exposes the first electrode, and a light-shielding layer on a surface of the PDL to shield light incident to the active layer, wherein an organic light-emitting diode (OLED) is electrically connected to one of the source electrode and the drain electrode.

The light-shielding layer may shield light having a wavelength of 400-450 nm.

The light-shielding layer may shield blue light.

The PDL may include a photosensitive high polymer.

The PDL may include at least one of a photo sensitive polyimide (PSPI), a photo sensitive acryl (PA), and a photo sensitive novolac resin.

The light-shielding layer may be formed by oxidizing the surface of the PDL.

The light-shielding layer may be formed by thermally processing the PDL at a temperature of approximately 230-250° C. in an atmospheric pressure state.

The light-shielding layer may prevent light emitted from the OLED from entering the active layer.

The active layer may include an oxide semiconductor.

Light emitted from the OLED may be irradiated toward the substrate.

According to another embodiment, there is provided a method of manufacturing an organic light-emitting display apparatus. The method may include forming a gate electrode and a first electrode on a substrate, forming a gate insulating layer covering the gate electrode on the substrate, forming an active layer on the gate insulating layer, forming an insulating layer covering at least a channel region of the active layer, forming a pixel defining layer (PDL) covering the source electrode and the drain electrode and including an opening that exposes the first electrode, and forming a light-shielding layer, shielding light incident to the active layer on the PDL. An OLED is electrically connected with one of the source electrode and the drain electrode.

The light-shielding layer may shield light having a wavelength of 400-450 nm.

The light-shielding layer may shield blue light.

The PDL may include a photosensitive high polymer.

The PDL may include at least one of a photo sensitive polyimide (PSPI), a photo sensitive acryl (PA), and a photo sensitive novolac resin.

The light-shielding layer may be formed by oxidizing the surface of the PDL.

The light-shielding layer may be formed by thermally processing the PDL at a temperature of approximately 230-250° C. in an atmospheric pressure state.

The light-shielding layer may prevent light emitted from the OLED from entering the active layer.

The active layer may include an oxide semiconductor.

Light emitted from the OLED may be irradiated toward the substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
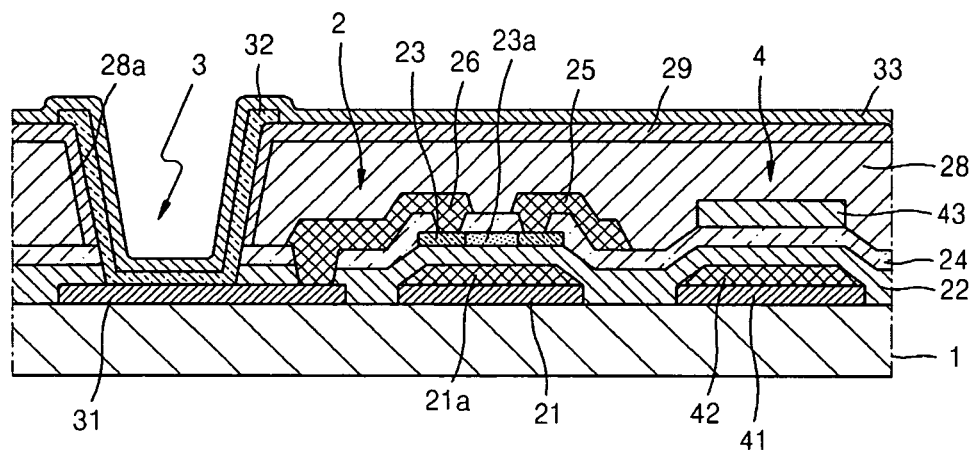
FIG. 1 illustrates a cross-sectional view schematically showing an organic light-emitting display apparatus according to an embodiment.

Korean Patent Application No. 10-2010-0087032, filed on Sep. 6, 2010, in the Korean Intellectual Property Office, and entitled: "Organic Light-Emitting Display Apparatus and Method of Manufacturing the Same," is incorporated by reference herein in its entirety.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view schematically showing an organic light-emitting display apparatus according to an embodiment.

Referring to FIG. 1, a thin-film transistor (TFT) 2, an organic light-emitting diode (OLED) 3, and a capacitor 4 may be provided on a substrate 1. A pixel of the organic light-emitting display apparatus is shown in FIG. 1. The organic light-emitting display apparatus according to embodiment may include a plurality of pixels, each of which may be structured as shown in FIG. 1.

The TFT 2 includes a gate electrode 21 formed on the substrate 1, a gate insulating layer 22 covering the gate electrode 21, an active layer 23 formed on the gate insulating layer 22, an insulating layer 24 formed on the gate insulating layer 22 to cover the active layer 23, and a source electrode 25 and a drain electrode 26 formed on the insulating layer 24 to contact the active layer 23. Although the TFT 2 shown in FIG. 1 has a bottom gate structure as an example, it is to be understood that the TFT 2 may have a top gate structure without limiting the scope of the present invention to those examples.

A buffer layer (not shown) may be further formed of silicon oxide on the substrate 1.

The gate electrode 21 may be formed of conductive metal as a single layer or a plurality of layers 21, 21a on the substrate 1. The gate electrode 21 may include molybdenum.

The gate insulating layer 22 may be formed of, but not limited to, silicon oxide, tantalum oxide, or aluminum oxide.

The patterned active layer 23, which may be an oxide semiconductor, is formed on the gate insulating layer 22. The patterned active layer 23 may include one or more elements selected from gallium (Ga), indium (In), zinc (Zn), and tin (Sn), and oxygen. For example, the active layer 23 may include a material such as ZnO, ZnGaO, ZnInO, GaSnO, GaSnO, ZnSnO, InSnO, or ZnGaInO. For example, the patterned active layer 23 may be a G-I-Z-O [a(In$_2$O$_3$)b(Ga$_2$O$_3$)c(ZnO)] layer (a, b, and c are real numbers satisfying a condition of a≥0, b≥0, and c>0).

To cover the active layer 23, the insulating layer 24 is formed. The insulating layer 24 insulates a channel 23a of the active layer 23, and as shown in FIG. 1, may be formed on, but not limited to, the channel 23a. Although not shown in FIG. 1, the insulating layer 24 may be formed to cover most of a region of the active layer 23 except for a region which contacts the source electrode 25 and the drain electrode 26.

Source electrode 25 and the drain electrode 26, which contact the active layer 23, are formed on the insulating layer 24.

A pixel defining layer (PDL) 28 is formed to cover the source electrode 25 and the drain electrode 26. The PDL 28 may include an opening 28a that exposes a first electrode 31 formed on the substrate 1. To expose the first electrode 31, the opening 28a is formed by removing portions of the PDL 28, the insulating layer 24, and the gate insulating layer 22. An organic layer 32 and a second electrode 33 are formed on the first electrode 31 exposed through the PDL.

The PDL 28, in addition to defining a light-emitting region, widens a distance between an end of the first electrode 31 and the second electrode 33, thereby preventing an electric field from concentrating in the edge of the first electrode 31 and thus preventing short circuits between the first electrode 31 and the second electrode 33.

The PDL 28 may be formed of a photosensitive high polymer. For example, the PDL 28 may be formed of a photosensitive polyimide (PSPI), a photosensitive acryl (PA), a photosensitive novolac resin, etc.

A light-shielding layer 29 is formed to cover the PDL 28. The light-shielding layer 29 may prevent light from entering the TFT 2. The light-shielding layer 29 may be formed by oxidizing the surface of the PDL 28. The light-shielding layer 29 will be described below in more detail.

The first electrode 31 is provided patterned for each pixel.

In the case of a front light-emitting structure which directs an image towards the second electrode 33, the first electrode 31 may be provided as a reflective electrode. To this end, the first electrode 31 may include a reflective layer made of an alloy such as Al, Ag, and the like.

When the first electrode 31 is used as an anode electrode, the first electrode 31 includes a layer formed of a metal oxide having a high work function (absolute value), such as ITO, IZO, ZnO, or the like. When the first electrode 31 is used as a cathode electrode, the first electrode 31 uses a high-conductivity metal having a low work function (absolute value), such as Ag, Mg, Al, Pt, Pd, Au, Ni, Nd, Ir, Cr, Li, Ca, or the like. In this case, the aforementioned reflective layer is not necessary.

The second electrode 33 may be provided as a transmissive electrode. To this end, the second electrode 33 may include a semi-transmissive reflective layer, which is a thin film formed of Ag, Mg, Al, Pt, Pd, Au, Ni, Nd, Ir, Cr, Li, Ca, or the like, or may include a transmissive metal oxide such as ITO, IZO, ZnO, or the like. When the first electrode 31 is used as an anode electrode, the second electrode 33 is used as a cathode electrode; otherwise, when the first electrode 31 is used as a cathode electrode, the second electrode 33 is used as an anode electrode.

The organic layer 32 interposed between the first electrode 31 and the second electrode 33 may be provided by depositing a light-emitting layer, and optionally, one or more of a hole injection/transport layer and an electron injection/transport layer. The light-emitting layer is included in the organic layer 32.

While not shown in FIG. 1, a protective layer may be further formed on the second electrode 33 and sealing may be performed with glass.

The capacitor 4 includes lower electrodes 41 and 42 and an upper electrode 43, between which the gate insulating layer 22 and the insulating layer 24 may be interposed. The lower electrodes 41 and 42 may be formed simultaneously with gate electrodes 21 and 21a of the TFT 2 and the first electrode 31 of the organic light-emitting element 3.

Hereinafter, the light-shielding layer 29 of the OLED display according to an embodiment will be described in detail.

More specifically, when the active layer 23 is formed using an oxide semiconductor, it is desirable to block light, oxygen, and moisture. Oxygen and moisture may be blocked to some extent by encapsulation in a process of manufacturing the first electrode 31, the second electrode 33, or the organic light-emitting display apparatus. Of light incident to the TFT 2, external light may be partially shielded by ultraviolet (UV) coating, a black matrix, or the like. However, light emitted from the organic layer 32 of the OLED 3, especially, blue light having a wavelength of 400 nm-450 nm, may have an undesirable influence upon the TFT 2.

To solve such a problem, the organic light-emitting display apparatus according to an embodiment is structured such that the light-shielding layer 29 covers the PDL 28, thereby preventing not only light emitted from the organic layer 32 but also external light from directly entering the active layer 23.

The light-shielding layer 29 may be formed by oxidizing the surface of the PDL 28. The PDL 28 may be formed of a photosensitive high polymer, and may be thermally processed in an oxygen atmosphere, thus forming the light-shielding layer 29 tinged with a yellowish brown color on the surface of the PDL 28. Because of being tinged with a yellowish brown color, the light-shielding layer 29 may shield blue light. The light-shielding layer 29 may shield light incident through the PDL 28 as well as light incident toward the TFT 2 from the organic layer 32.

According to aspects described above, blue light may be prevented from directly entering the active layer 23, thereby improving the stability of an oxide and thus reducing the occurrence of a product failure and increasing user convenience.

FIGS. 2 through 8 illustrate cross-sectional views for sequentially describing a method of manufacturing the organic light-emitting display apparatus, according to an embodiment.

Figure 2:
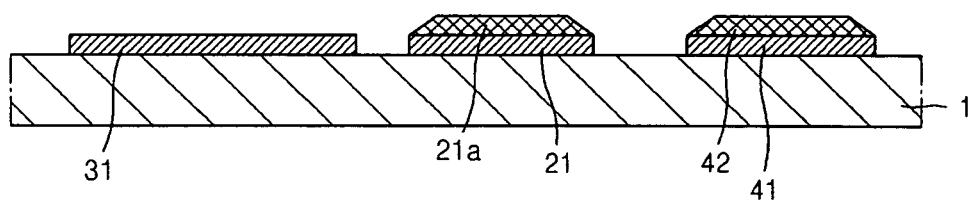
FIGS. 2 through 8 illustrate cross-sectional views for sequentially describing a method of manufacturing an organic light-emitting display apparatus, according to an embodiment.

Referring to FIG. 2, the substrate 1 is provided. For the substrate 1, silicon (Si), glass, or an organic material may be used. In the case of a Si substrate, an insulating layer (not shown) may be further formed on a surface of the Si substrate through thermal oxidation. Next, a conductive material, such as metal or a conductive metal oxide, is applied onto the substrate 1 and then is patterned, thereby forming the first electrode 31, the gate electrodes 21 and 21a, and the lower electrodes 41 and 42.

Figure 3:
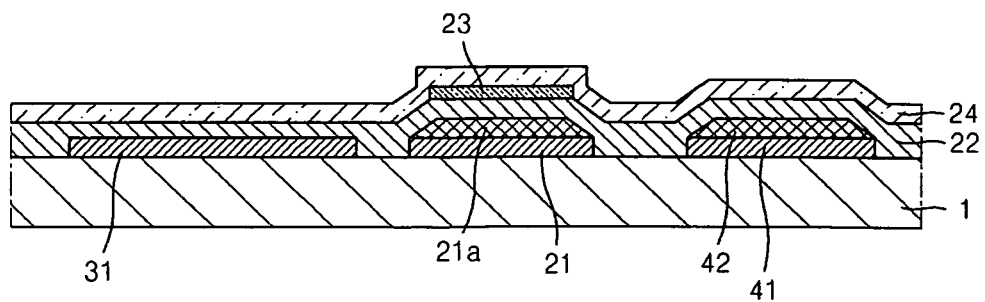

Referring to FIG. 3, an insulating material is applied onto the first electrode 31, the gate electrodes 21 and 21a, and the lower electrodes 41 and 42 and then is patterned, thus forming the gate insulating layer 22. Next, a semiconductor material is applied onto the gate insulating layer 22 corresponding to the gate electrode 21 through physical vapor deposition (PVD), chemical vapor deposition (CVD), or atomic layer deposition (ALD) and then is patterned, thus forming the active layer 23. The semiconductor material may be a G-I-Z-O layer [a(In$_2$O$_3$)b(Ga$_2$O$_3$)c(ZnO) layer] (a, b, and c are real numbers which satisfy a condition of a≥0, b≥0, and c>0). Next, the insulating layer 23 is formed to cover the active layer 23.

Figure 4:
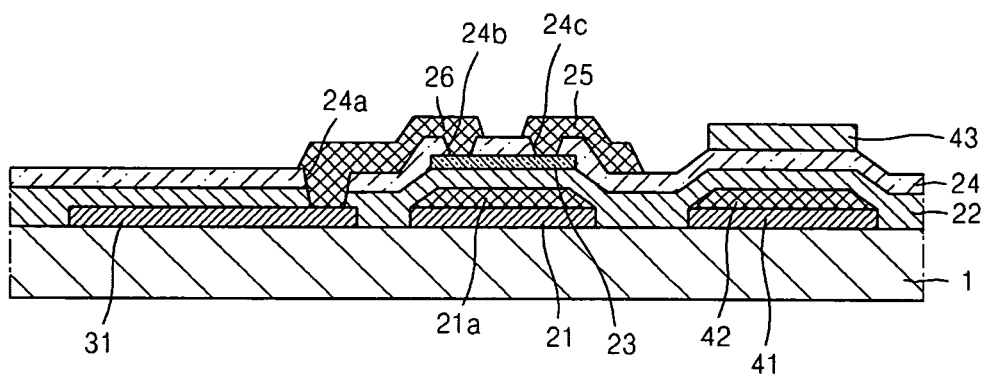

Referring to FIG. 4, contact holes 24a, 24b, and 24c are formed in the insulating layer 24 and the gate insulating layer 22. The contact hole 24a may expose a portion of the first electrode 31, and the contact holes 24b and 24c may expose a portion of the active layer 23. A material such as metal or a conductive metal oxide is applied onto the insulating layer 24 and then is patterned, thereby forming the source electrode 25 and the drain electrode 26. The drain electrode 26 is formed in the contact holes 24a and 24b, and the active layer 23 and the first electrode 31 are electrically connected to each other by the drain electrode 26.

Figure 5:
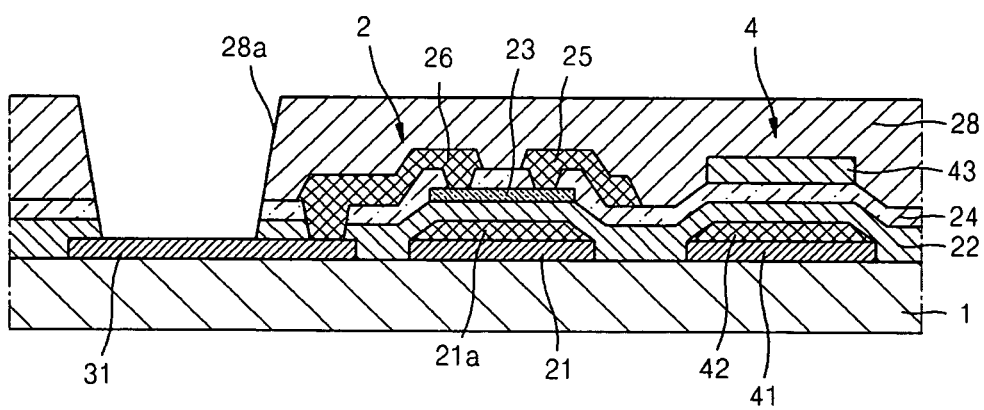

Referring to FIG. 5, the PDL 28 is formed to cover the source electrode 25 and the drain electrode 26. The PDL 28 includes the opening 28a which exposes a portion of the first electrode 31. The PDL 28 may be formed of a photosensitive high polymer. For example, the PDL 28 may be formed of a photosensitive polyimide (PSPI), a photosensitive acryl (PA), a photosensitive novolac resin, etc.

A detailed process of an example of forming the PDL 28 is as described as follows. The photosensitive high polymer is coated onto the substrate 1 to cover the source electrode 25 and the drain electrode 26. Thereafter, soft baking is performed. The soft baking may be thermal processing at a temperature of approximately 90-110° C. for about 1 minute. The photosensitive high polymer is applied onto the substrate 1 after the photosensitive high polymer has dissolved in a solvent, and the solvent may evaporate by the soft baking. The photosensitive high polymer applied onto the substrate 1 is then patterned to expose the first electrode 31. The patterning may be performed by a photoresist (PR) process. The patterned photosensitive high polymer is hard-baked to form the PDL 28. The hard baking may be thermal processing at a temperature of approximately 110-130° C. Through the hard baking, the photosensitive high polymer may be thermally hardened.

Figure 6:
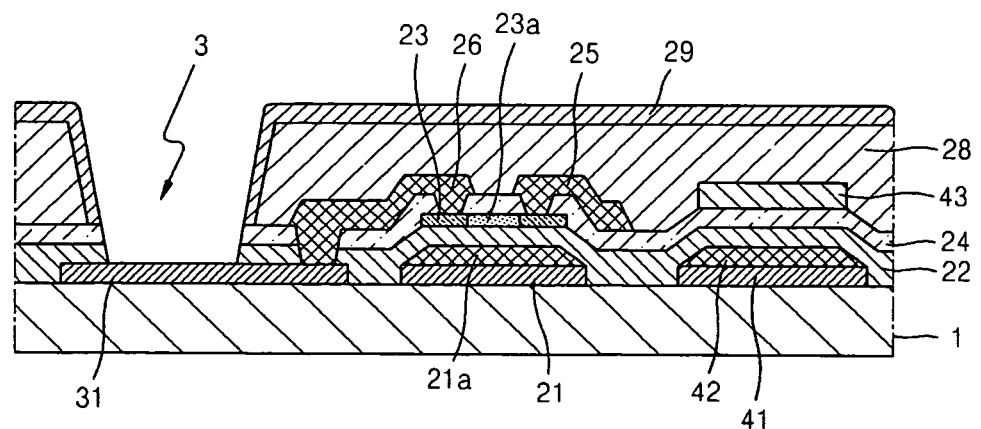

Referring to FIG. 6, the light-shielding layer 29 (indicated as 41) is formed on the surface of the PDL 28. After the formation of the PDL 28, the surface of the PDL 28 is oxidized, thus forming the light-shielding layer 29 on the surface of the PDL 28. More specifically, after the formation of the PDL 28, curing is performed in an oxygen atmosphere. The curing may be thermal processing at a temperature of approximately 230-250° C. in an atmospheric pressure state. When the curing is performed in an oxygen atmosphere, oxidation occurs on the surface of the PDL 28 and thus the surface of the PDL 28 becomes tinged with a yellowish brown color. The light-shielding layer 29 may have a thickness of several hundred Å.

Since the light-shielding layer 29 is tinged with a yellowish brown color, the light-shielding layer 29 may shield blue light. The light-shielding layer 29 may shield light incident through the PDL 28 as well as light incident toward the TFT 2 from the organic layer 32.

According to the embodiments described above, blue light may be prevented from directly entering the active layer 23, thereby improving the stability of an oxide and thus reducing the occurrence of a product failure and increasing user convenience.

Figure 8:
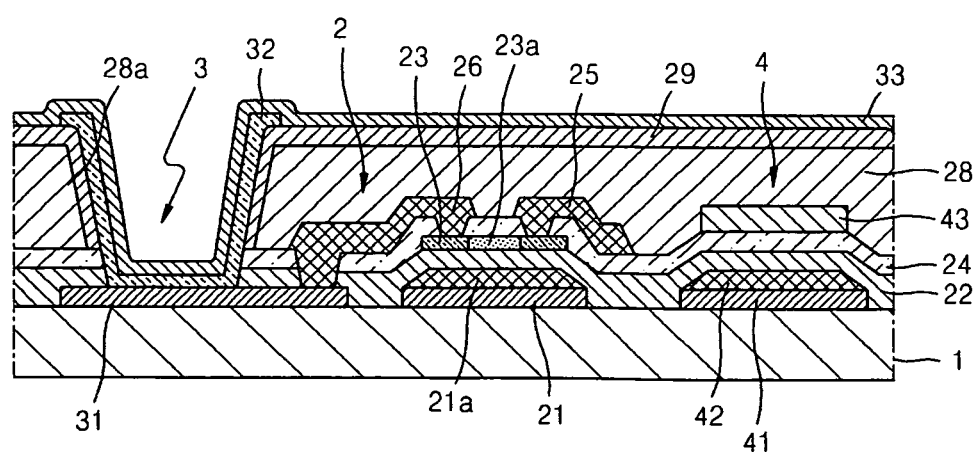

Referring to FIG. 8, the organic layer 32 and the second electrode 33 are formed on the first electrode 31 exposed through the PDL 28, thus completing the manufacture of the OLED display as shown in FIG. 1.

Figure 7:
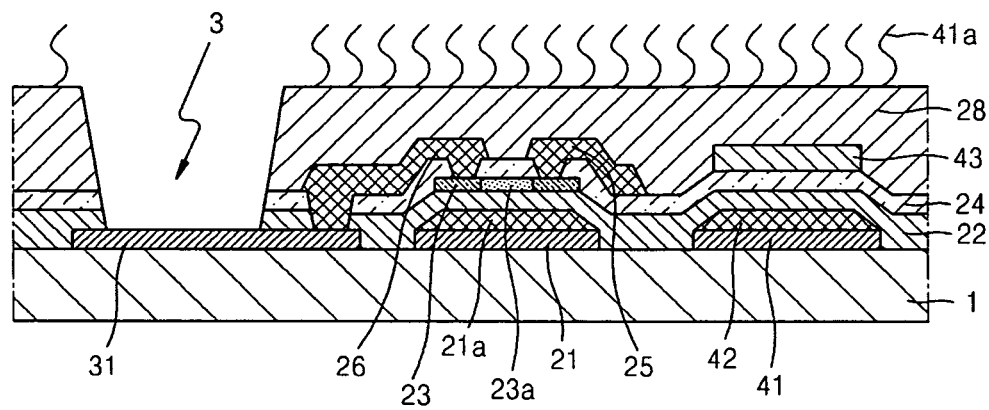

As a modification, surface-treatment may be performed with plasma or UV/O$_3$ before the formation of the organic layer 32. In particular, when the PDL 28 is formed of polyimide as shown in FIG. 7, surface-treatment may be performed with an Ar plasma. By performing surface-treatment with an Ar plasma, a radical group 41a may be formed on the surface of the PDL 28 as shown in FIG. 7. After the surface-treatment, paint or dye may be applied onto the PDL 28, forming the light-shielding layer 29.

As such, since the light-shielding layer 29 according to the embodiments is formed of a material capable of shielding blue light, the light-shielding layer 29 prevents blue light from directly entering the TFT 2, thereby improving the stability of an oxide and thus reducing the occurrence of a product failure and increasing user convenience.

As can be appreciated from the foregoing description, light irradiated from an external source is prevented from entering an active layer of a TFT, thus enhancing the stability of the active layer.

While aspects of the present invention have been particularly shown and described with reference to an exemplary embodiment thereof, it will be understood by those of ordinary skill in the art that various changes in form and details may be made therein without departing from the spirit and scope of the present invention as defined by the following claims. Accordingly, the true scope of the present invention should be defined by the appended claims.

What is claimed is:

1. An organic light-emitting display apparatus, comprising:
    a substrate;
    a first electrode and a gate electrode on the substrate, the first electrode and the gate electrode being on a same plane;
    an active layer insulated from the gate electrode;
    a source electrode and a drain electrode which are insulated from the gate electrode and contact the active layer;
    an insulating layer interposed between the source and drain electrodes and the active layer;
    a pixel defining layer (PDL) on the insulating layer, the PDL covering the source electrode and the drain electrode and including an opening that exposes the first electrode; and
    a light-shielding layer covering the PDL to shield light incident to the active layer, wherein
    an organic light-emitting diode (OLED) is electrically connected with one of the source electrode and the drain electrode.

2. The organic light-emitting display apparatus as claimed in claim 1, wherein the light-shielding layer shields light having a wavelength of 400-450 nm.

3. The organic light-emitting display apparatus as claimed in claim 1, wherein the light-shielding layer shields blue light.

4. The organic light-emitting display apparatus as claimed in claim 1, wherein the PDL includes a photosensitive high polymer.

5. The organic light-emitting display apparatus as claimed in claim 4, wherein the PDL includes at least one of a photo sensitive polyimide (PSPI), a photo sensitive acryl (PA), and a photo sensitive novolac resin.

6. The organic light-emitting display apparatus as claimed in claim 4, wherein the light-shielding layer is formed by oxidizing the surface of the PDL.

7. The organic light-emitting display apparatus as claimed in claim 6, wherein the light-shielding layer is formed by thermally processing the PDL at a temperature of approximately 230-250° C. in an atmospheric pressure state.

8. The organic light-emitting display apparatus as claimed in claim 1, wherein the PDL includes a photosensitive high polymer, the light-shielding layer being an oxidized surface of the PDL, the oxidized surface of the PDL extending along a sidewall of the opening that exposes the first electrode such that the light-shielding layer prevents light emitted from the OLED from entering the active layer.

9. The organic light-emitting display apparatus as claimed in claim 1, wherein the active layer includes an oxide semiconductor.

10. The organic light-emitting display apparatus as claimed in claim 1, wherein light emitted from the OLED is irradiated toward the substrate.

11. A method of manufacturing an organic light-emitting display apparatus, the method comprising:
    forming a gate electrode and a first electrode on a substrate, the first electrode and the gate electrode being on a same plane;
    forming a gate insulating layer covering the gate electrode on the substrate;
    forming an active layer on the gate insulating layer;
    forming an insulating layer covering at least a channel region of the active layer;
    forming a source electrode and a drain electrode that are insulated from the gate electrode and that contact the active layer;
    forming a pixel defining layer (PDL) covering the source electrode and the drain electrode, the PDL including an opening that exposes the first electrode;
    forming a light-shielding layer shielding light incident to the active layer, on the PDL, the light-shielding layer covering the PDL; wherein
    an organic light-emitting diode (OLED) is electrically connected with one of the source electrode and the drain electrode.

12. The method as claimed in claim 11, wherein the light shielding layer shields light having a wavelength of 400-450 nm.

13. The method as claimed in claim 11, wherein the light-shielding layer shields blue light.

14. The method as claimed in claim 11, wherein the PDL includes a photosensitive high polymer.

15. The method as claimed in claim 14, wherein the light-shielding layer is formed by oxidizing the surface of the PDL.

16. The method as claimed in claim 15, wherein the light-shielding layer is formed by thermally processing the PDL at a temperature of approximately 230-250° C. in an atmospheric pressure state.

17. The method as claimed in claim 11, wherein the PDL includes at least one of a photo sensitive polyimide (PSPI), a photo sensitive acryl (PA), and a photo sensitive novolac resin.

18. The method as claimed in claim 11, wherein the PDL includes a photosensitive high polymer, the light-shielding layer being formed by oxidizing a surface of the PDL, the oxidized surface of the PDL being formed to extend along a sidewall of the opening that exposes the first electrode such that the light-shielding layer prevents light emitted from the OLED from entering the active layer.

19. The method as claimed in claim 11, wherein the active layer includes an oxide semiconductor.

20. The method as claimed in claim 11, wherein light emitted from the OLED is irradiated toward the substrate.

* * * * *